United States Patent [19]

Gollinger

[11] 3,868,597

[45] Feb. 25, 1975

[54] INTEGRABLE QUARTZ OSCILLATOR CIRCUIT EMPLOYING FIELD EFFECT TRANSISTORS

[75] Inventor: Wolfgang Gollinger, Gundelfingen, Germany

[73] Assignee: ITT Industries, Inc., New York, N.Y.

[22] Filed: May 7, 1974

[21] Appl. No.: 467,751

[30] Foreign Application Priority Data

May 11, 1973 Germany ............................ 2323858

[52] U.S. Cl. ............................ 331/116 R, 331/159

[51] Int. Cl. ............................................ H03b 5/36

[58] Field of Search ......... 331/116 R, 159; 58/23 R, 58/23 A, 23 AC

[56] References Cited

UNITED STATES PATENTS 3,714,867 2/1973 Dargent ...................... 331/116 R X 3,757,510 9/1973 Dill ............................ 331/116 R X

*Primary Examiner*—Siegfried H. Grimm
*Attorney, Agent, or Firm*—John T. O'Halloran; Menotti J. Lombardi, Jr.; Vincent Ingrassia

[57] ABSTRACT

An integrated quartz crystal oscillator circuit using field-effect transistors provides higher output voltages than the known prior art circuit. This is obtained by a pair of series capacitor and parallel diode voltage dividers which are inserted at the input and output terminals of the circuit. Variations include use of two of the same conductivity type transistors for an oscillator and load resistance stages or a complementary pair of opposite conductivity types. Additional parallel clamping diodes are used with the second circuit type.

1 Claim, 2 Drawing Figures

INTEGRABLE QUARTZ OSCILLATOR CIRCUIT EMPLOYING FIELD EFFECT TRANSISTORS

BACKGROUND OF THE INVENTION

This invention relates to a monolithic integrable quartz oscillator circuit. From pages 1,047 to 1,054 of the "Proceedings of the IEEE," for September 1972, and more particularly from FIG. 7 on page 1,049, there is known a monolithic integrable quartz oscillator circuit employing insulated-gate field-effect transistors of the same or complementary conductivity type which is suitable for use in quartz clocks. In this circuit a transistor provided with a drain resistance and operated in a source connection, is connected between the drain and the gate terminal to the parallel arrangement of a resistor and a quartz oscillator, each having one capacitor arranged between the gate and the source, as well as between the drain and the source terminal. As a drain resistance there may be used an ohmic resistor as well as an insulated-gate field-effect transistor connected as a resistor, of the same conductivity type, as well as a complementary insulated-gate field-effect transistor whose gate terminal is connected to the gate terminal of the transistor oscillator.

The frequency-stabilized output signal of this oscillator circuit is fed to the input of a binary frequency divider chain, or serves as the clock frequency for counters composed of shift registers, likewise containing insulated-gate field-effect transistors. The input capacitance of the field-effect transistors controlled by the output signal of the quartz oscillator, when directly controlling this subsequently following circuit, can be included in the capacitance lying between the source and the drain terminal of the transistor oscillator.

Owing to the fact that, especially in the fields of clocks, the development trend is towards higher frequency quartz oscillators, the reason for this is high-frequency quartz oscillators whose oscillation frequency is in the order of some Megahertz, have better properties and are easier to manufacture. However, the problem remains of controlling the aforementioned subsequently following circuits in such a way as to be still operable at these higher frequencies.

Further, current consumption must be minimized with the supply voltage, if possible, corresponding to that of one single cell battery, i.e. to a value ranging between 1 and 1.5 V.

Considering that the cut-off frequency of the subsequently following circuit is substantially determined by the recharging currents resulting during the recharge by the clock signals in the aforementioned input capacitances, and that the speed of the subsequently following circuit can only be increased when these recharging currents are enlarged, the known quartz oscillator circuit must be capable of providing the increased recharging currents.

From the known relationships relating to the recharging currents $$I = \beta/2\,(U_G - U_T)^2 \text{ for } U_G - U_T \leq U_{DS}$$

and $$I = \beta\,[(U_G - U_T)U_{DS} - \tfrac{1}{2}U^2_{DS}] \quad \text{for } U_G - U_T > U_{DS},$$

wherein $U_G$ is the gate voltage, $U_T$ the threshold voltage, $U_{DS}$ the drainsource voltage, and $\beta$ the mutual-conductance constant of the controlled transistors, it will be recognized that the recharging currents are substantially dependent upon the amplitude of the gate voltage $U_G$. In the known circuits the gate voltage controlling the substantially following stages, is lower or at most equal to the supply voltage $U_B$.

SUMMARY OF THE INVENTION

It is the object of the present invention to provide a monolithic integrable quartz oscillator circuit employing insulated-gate field-effect transistors which, when directly controlling the subsequently following frequency divider circuits, permits the use of a higher oscillator frequency.

According to a broad aspect of the invention there is provided a monolithic integrable quartz oscillator circuit having first and second outputs employing insulated-gate field-effect transistors comprising a source of supply voltage; an oscillator transistor having source, gate, and drain electrodes and a substrate terminal, said source electrode and said substrate terminal coupled to the zero point of the circuit; a load transistor having source, gate, and drain electrodes and a substrate terminal, said gate and drain electrodes coupled to the positive pole of said source of supply voltage, said source electrode coupled to the drain electrode of said oscillator transistor, and said substrate terminal coupled to the zero point of the circuit, said load transistor having a conductivity equivalent to that of said oscillator transistor; a resistor for fixing the D.C. operating point of the circuit having first and second terminals, said first terminal coupled to the gate electrode of said oscillator transistor and said second terminal coupled to the junction of the drain electrode of said oscillator transistor and the source electrode of said load transistor; an adjustable capacitor for providing fine adjustment of the oscillator frequency coupled between said first terminal and the zero point of the circuit; a first capacitor coupled between said second terminal and the zero point of the circuit; second and third capacitors coupled in series with said resistor, said second capacitor coupled between said first output and said first terminal, and said third capacitor coupled between said second output and said second terminal; a quartz crystal coupled between said first and second outputs; said first and second clamping diodes each having an anode coupled to the zero point of the circuit, the cathode of said first diode coupled to said first output, and the cathode of said second diode coupled to said second output.

The above and other objects of the present invention will be more clearly understood from the following detailed description taken in conjunction with the accompanying drawings, in which:

DESCRIPTION OF THE PREFERRED EMBODIMENT

Figure 1:
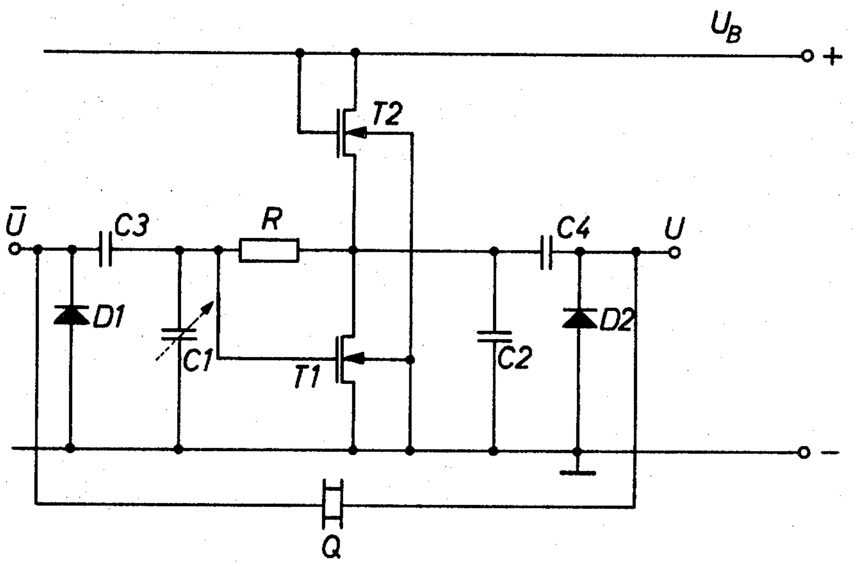
FIG. 1 is a schematic diagram of a quartz oscillator circuit according to the invention employing field-effect transistors of the same conductivity type.

FIG. 1 shows one embodiment of the inventive quartz oscillator circuit employing insulated-gate field-effect transistors of the same conductivity type, namely *n*-channel transistors. It consists of the oscillator transistor T1 which is operated in a source arrangement and comprises as a drain resistance the transistor T2 connected as a load resistor whose source electrode is connected to the drain electrode of the oscillator transistor T1, and whose gate, and drain electrode, are connected to the positive voltage-conducting pole of the supply voltage $U_B$. Between the point connecting the two transistors T1, T2 and the gate terminal of the oscillator transistor T1 there is arranged the resistor R fixing the D.C. operating point of the oscillator circuit.

Further, between the gate of the oscillator transistor T1 which may be regarded as the input electrode thereof, and the zero point of the circuit which is identical to the minus pole of the source of supply voltage in the embodiment according to FIG. 1, there is arranged the capacitor C1 whose capacitance may be adjusted thereby permitting fine adjustment of the oscillator frequency. Between the common connecting point of the two transistors which may be regarded as the output of the transistor oscillator, and the zero point of the circuit, there is arranged the capacitor C2.

Unlike the prior art arrangements, one capacitor each is connected in series with each of the quartz electrodes in the embodiment shown in FIG. 1, so that the quartz Q is arranged in parallel with the resistor R via the series capacitors C3 and C4. Furthermore, the connection points of the quartz are connected to the series capacitors via clamp diodes D1 and D2, to the zero point of the circuit. The polarity of these diodes is chosen such that the smallest amount of potential of the connection points of both the quartz and the series capacitors, is clamped to ground. With respect to the embodiment according to FIG. 1, the anodes of the clamp diodes D1 and D2 are applied to the zero point of the circuit. If an oscillator voltage with a higher amplitude is required, one series capacitor with the associated clamp diode may be omitted.

The sinusoidal oscillator voltage may now be taken off between one of the two quartz electrodes and the zero point of the circuit, with the two possible voltages U and $\bar{U}$ being inverse in relation to one another. Although in this way the source voltage of the oscillator transistor T1 is by one threshold voltage smaller than the supply voltage $U_B$, it is safe-guarded in that the output voltages U and $\bar{U}$ are greater by the transmission ratio of the capacitive voltage dividers C1–C3 and C2–C4. In the subsequently following circuits which are operated by these clock voltages, the recharging currents may be greater and, consequently, because the rise time-recharging current product is constant, this circuit may be operated at higher frequencies.

Figure 2:
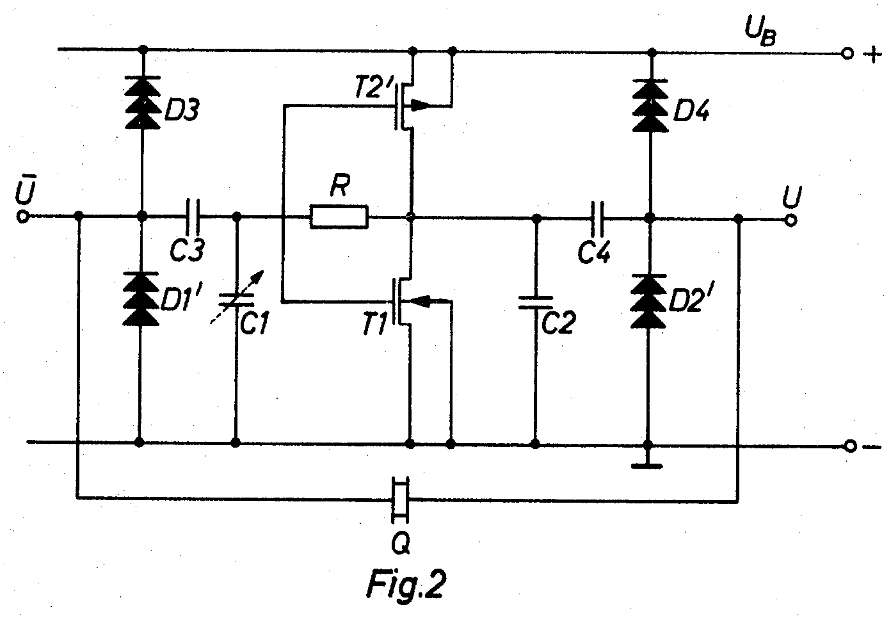
FIG. 2 is a schematic diagram of a quartz oscillator circuit employing complementary field-effect transistors.

FIG. 2 shows another embodiment of the invention employing complementary insulated-gate field-effect transistors, i.e. the transistor T1 according to FIG. 2 is an *n*-channel transistor while transistor T2′ is a p-channel transistor. Whereas in the embodiment according to FIG. 1, the two substrate terminals of the transistors T1 and T2 are both connected to the zero point of the circuit, in FIG. 2 this only applies to the transistor T1 while the substrate terminal of transistor T2′ is applied to the voltage-conducting pole of the source of supply voltage $U_B$. Otherwise, the embodiment in FIG. 2 corresponds to that of FIG. 1 with the exception that instead of the clamp diodes D1 and D2, there are shown in FIG. 2 the diode combinations D1′ and D2′ consisting of more than one series arranged diode. Moreover, the connection point of quartz electrodes and series capacitors in FIG. 2 is connected via additional clamp diodes D3 and D4, to the voltage conducting pole of the source of supply voltage (battery). In this way there is achieved a sufficient symmetry between the output voltages U and $\bar{U}$. Also in the case of the additional clamp diodes D3 and D4, one or more diodes may be used if so required. The forward direction of the clamp diodes D3 and D4 is identical to that of the clamp diodes D1, D2, i.e. all clamp diodes are connected in series in the same way.

The circuit arrangement according to the example of the embodiment shown in FIG. 2 is of advantage especially in cases where the circuits to be controlled are likewise composed of complementary insulated-gate field-effect transistors.

It should be clear that in the case of a monolithic integration, the quartz is not integrated as well. Also, variable capacitor C1 will generally have to be connected from the outside to the integrated circuit as a discrete component. The integrability of capacitors C3 and C4 will depend on the respective rating of these capacitors. As already mentioned, capacitor C2 is composed of the input capacitances of the subsequently following circuits and of a fixed value, with this fixed value being relatively small in the case of many circuits. Therefore, this partial capacitor can easily be integrated.

While the principles of the invention have been described above in connection with specific apparatus, it is to be clearly understood that this description is made only by way of example and not as a limitation on the scope of the invention.

I claim:

1. A monolithic integrable quartz oscillator circuit having first and second outputs employing insulated-gate field-effect transistors comprising:

a source of supply voltage;

an oscillator transistor having source, gate, and drain electrodes and a substrate terminal, said source electrode and said substrate terminal coupled to the zero point of the circuit;

a load transistor having source, gate, and drain electrodes and a substrate terminal, said gate and drain electrodes coupled to the positive pole of said source of supply voltage, said source electrode coupled to the drain electrode of said oscillator transistor, and said substrate terminal coupled to the zero point of the circuit, said load transistor having a conductivity equivalent to that of said oscillator transistor;

a resistor for fixing the D.C. operating point of the circuit having first and second terminals, said first terminal coupled to the gate electrode of said oscillator transistor and said second terminal coupled to the junction of the drain electrode of said oscillator transistor and the source electrode of said load transistor;

an adjustable capacitor for providing fine adjustment of the oscillator frequency coupled between said first terminal and the zero point of the circuit;

a first capacitor coupled between said second terminal and the zero point of the circuit;

second and third capacitors coupled in series with said resistor, said second capacitor coupled between said first output and said first terminal, and said third capacitor coupled between said second output and said second terminal;

a quartz crystal coupled between said first and second outputs; and first and second clamping diodes each having an anode coupled to the zero point of the circuit, the cathode of said first diode coupled to said first output, and the cathode of said second diode coupled to said second output.

* * * * *